United States Patent [19]

Gruner

[11] Patent Number: 4,596,762
[45] Date of Patent: Jun. 24, 1986

[54] ELECTRONIC THIN-FILM CIRCUIT AND METHOD FOR PRODUCING IT

[75] Inventor: Heiko Gruner, Beinwil am See, Switzerland

[73] Assignee: Robert Bosch GmbH, Stuttgart, Fed. Rep. of Germany

[21] Appl. No.: 509,433

[22] PCT Filed: Oct. 5, 1982

[86] PCT No.: PCT/DE82/00195
§ 371 Date: Jun. 2, 1983
§ 102(e) Date: Jun. 2, 1983

[87] PCT Pub. No.: WO83/01344
PCT Pub. Date: Apr. 14, 1983

[30] Foreign Application Priority Data
Oct. 6, 1981 [DE] Fed. Rep. of Germany ....... 3139670

[51] Int. Cl.⁴ ............................................. G03C 5/00
[52] U.S. Cl. .................................... 430/312; 430/313; 430/314; 430/315; 430/316; 430/318; 430/394; 430/319
[58] Field of Search ............... 430/313, 314, 315, 316, 430/318, 394, 312, 319

[56] References Cited

U.S. PATENT DOCUMENTS

| | | | |
|---|---|---|---|
| 3,287,191 | 11/1966 | Borth | 430/318 |
| 3,423,205 | 1/1969 | Skaggs et al. | 430/394 |
| 3,634,159 | 1/1972 | Croskery | 430/312 |
| 3,649,392 | 3/1972 | Schneck | 430/316 |
| 3,700,445 | 10/1972 | Croson | 430/316 |
| 3,751,248 | 8/1973 | Goell | 430/316 |
| 4,075,416 | 2/1978 | Küttner et al. | 174/68.5 |
| 4,424,409 | 1/1984 | Küttner | 174/68.5 |

Primary Examiner—John E. Kittle
Assistant Examiner—José G. Dees
Attorney, Agent, or Firm—Frishauf, Holtz, Goodman & Woodward

[57] ABSTRACT

An electronic thin-film circuit having a substrate plate comprising an insulating material and having a resistance film partially covering the substrate plate is proposed. The resistance film forms a first pattern and a second pattern. The first pattern defines tracks and/or connection contacts, while the second pattern defines circuit elements of the electronic thin-film circuit. A metal film which is capable of being soldered and of being reinforced by electroplating is disposed above the resistance film in the vicinity of the first pattern. Inside the first pattern, a soft-solder film is applied to parts of the metal film which is capable of being soldered and of being reinforced by electroplating, in order to form tracks and/or connection contacts which are reinforced with soft solder. A gold film is applied to other parts, not coated with soft solder, of the metal film which is capable of being soldered and of being reinforced by electroplating, inside the first pattern, in order to form tracks and/or connection contacts which are reinforced with gold. A bonding wire is secured to the gold film.

5 Claims, 7 Drawing Figures

ELECTRONIC THIN-FILM CIRCUIT AND METHOD FOR PRODUCING IT

The invention relates generally to an electronic thin-film circuit having an insulating substrate with a resistance film and a conductive metal film deposited thereon.

BACKGROUND

An electronic thin-film circuit of this type is already known from German Patent Disclosure Document DE-OS No. 29 06 813. In thin-film circuits of this kind, the soft-solder film is capable of increasing the conductivity of the tracks to a sufficient extent only if the tracks are relatively wide. With finely structured tracks, however, the specific resistance of the soft solder does not suffice for this purpose. There are also difficulties associated with applying the soft solder. Furthermore, the soft-solder film in the vicinity of the connection contacts is suitable only for applying hybrid units which are supposed to be incorporated into the circuit by the reflow soldering process. Semiconductor elements not provided with a housing, however, cannot be introduced into the circuit with the aid of the soft-solder film. Semiconductor elements of this kind and their bonding wires also cannot be applied without difficulty to the locations not coated with soft solder, where the metal film which is solderable and capable of being reinforced by electroplating has been laid bare.

THE INVENTION

Briefly, the thin-film circuit of the present invention reinforces the connection tracks by depositing gold thereon and has the advantage over the prior art that with finely structured tracks, the track conductivity is increased to a sufficient extent by means of the gold film that is applied, and that furthermore the opportunity is afforded of accommodating in the hybrid circuit even semiconductor elements which have not been provided with a housing. These elements are then applied by means of conductive glue to the connection areas coated with gold. The electrical contact between the internal semiconductor metal layer and the external hybrid circuit metal layer, the latter reinforced with gold, is then established with the aid of the bonding technique.

DRAWING

One exemplary embodiment of the electronic thin-film circuit according to the invention is shown in the drawing and explained in detail in the following description. Shown are:

FIG. 1, a detail of an electronic thin-film circuit according to the invention, seen in a plan view;

FIG. 2, a section taken along the line A–A' of FIG. 1;

FIGS. 3a–3d, the electronic thin-film circuit of FIGS. 1 and 2 in the course of being fabricated, showing the various method steps to be performed in accordance with the invention;

FIG. 4, a sectional illustration explaining the effect of the application of an additional thin layer of photosensitive resist after the gold film has been applied.

DESCRIPTION OF THE EXEMPLARY EMBODIMENT

Figure 1:
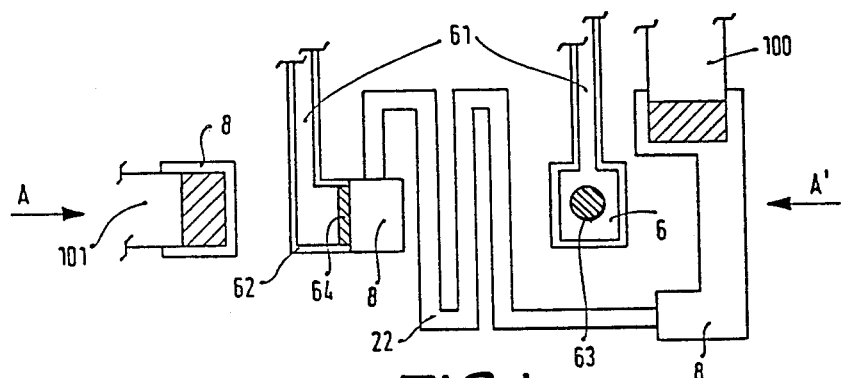
Figure 2:
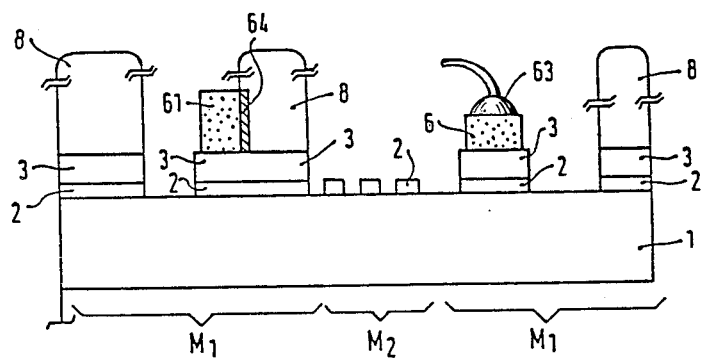

In the electronic thin-film circuit shown in FIGS. 1 and 2, a resistance film 2, which may be of tantalum oxynitride, is applied to a substrate plate 1 of insulating material. The resistance film 2 partially covers the substrate plate 1, forming a first pattern $M_1$ and a second pattern $M_2$. The first pattern $M_1$ defines tracks and/or connection contacts, while the second pattern $M_2$ defines circuit elements of the electronic thin-film circuit. In the vicinity of the first pattern $M_1$, a metal film 3 which is solderable and can be reinforced by electroplating is disposed above the resistance film 2; this metal film 3 may be of nickel, and an intermediate film acting as a diffusion block may be disposed if needed between the resistance film 2 and the metal film 3 which is solderable and capable of being reinforced by electroplating. An intermediate film of this type may be embodied and fabricated in the manner described in German Patent Disclosure Document DE-OS No. 29 06 813, for example. A soft-solder film 8 is applied to parts of the metal film 3 which is solderable and can be reinforced by electroplating, inside the first pattern $M_1$, in order to form tracks and/or connection contacts which are reinforced with soft solder. On other parts of the metal film 3 capable of being soldered and reinforced by electroplating, which parts are not coated with soft solder, gold films 6, 61 are applied inside the first pattern $M_1$ in order to form tracks and/or connection contacts reinforced with gold. At the point where the gold film 61 and the soft-solder film 8 adjoin one another, a narrow transition zone 64 is provided, which contains both gold and soft solder and establishes a low-resistance contact between the two adjacent films 8, 61. A bonding wire is secured to the gold film 6 at 63. In FIG. 1, reference numeral 22 designates that portion of the resistance film 2 which acts as a resistor element of the electronic thin-film circuit and is not covered with any further metallized layers. This portion 22 of the resistance film 2 forms the second pattern $M_2$. In FIG. 1, a capacitor is soldered onto the soft-solder film 8 at 100, and a rack electrode is soldered onto this film 8 at 101.

Figure 4:
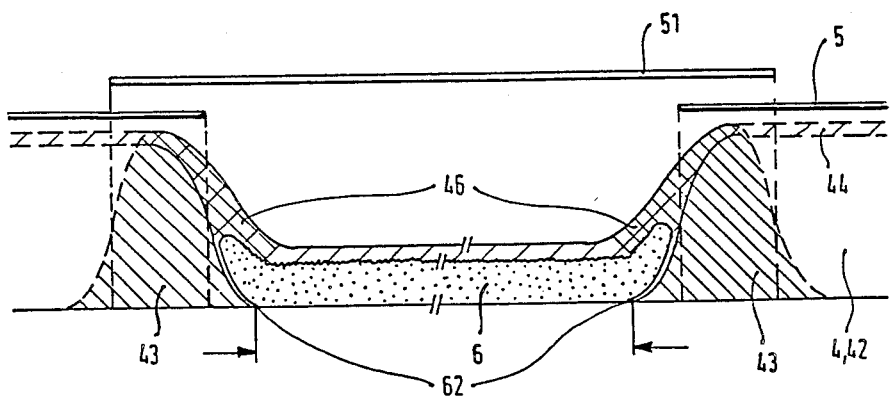

FIGS. 3a–3d, together with FIG. 4, show the electronic thin-film circuit according to the invention during the course of its fabrication.

Figure 3A:
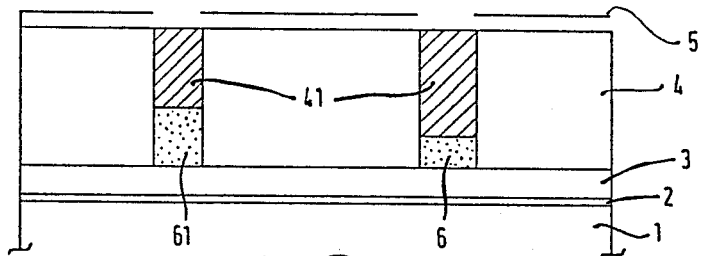
Figure 3B:
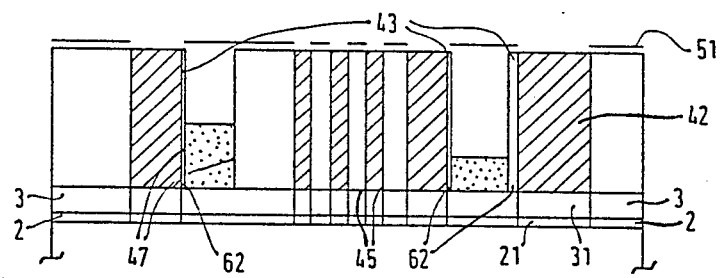
Figure 3C:
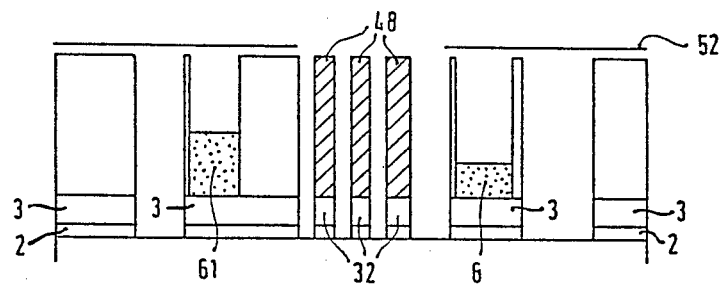
Figure 3D:
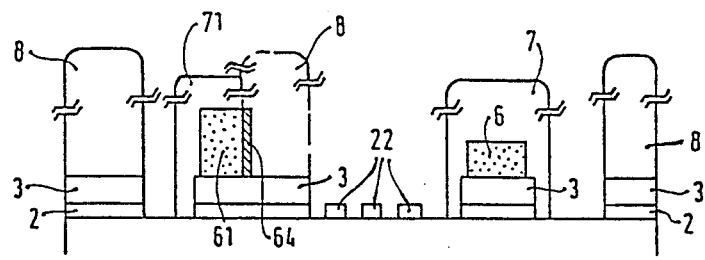

As shown in FIG. 3a, a continuous resistance film 2 has first been applied to the substrate plate 1, and then a continuous metal film 3 capable of being soldered and of being reinforced by electroplating has been applied to this resistance film 2. A photosensitive resist film 4 has been applied to the metal film 3 that can be soldered and can be reinforced by electroplating. The photosensitive resist film 4 is exposed to light at the points marked 41, with the aid of a photographic exposure mask 5, and then removed by photographic developing, so that it is possible to apply the gold films 6, 61 by electrodeposition to the thus-bared points of the metal film 3. The thickness of the gold films may be adapted to their intended purpose; if only the bonding technique is to be used, then a gold film having a film thickness of 1 $\mu$m will suffice. If the gold film is additionally intended for increasing the conductivity of tracks which for reasons of space are very narrow, then a gold film thickness of from 2 to 6 $\mu$m is required, depending upon the track width, which may vary from 200 down to 20 $\mu$m. Soldering techniques are not capable of producing such narrow tracks with sufficient conductivity.

Subsequently, in a second photographic exposure process (FIG. 3b), further parts 42 of the photosensitive resist film 4 are exposed to light using the photographic exposure mask 51 and are developed, in order to produce the geometry of the circuit by etching away the thus-bared parts 31 and 21 of the metal film 3 and the resistance film 2. This method sequence is made possible because, counter to expectations, the gold films 6 and 61 can be deposited so thickly in the resist-film windows 41 on the metal film 3 and on the underpart of the photosensitive resist film 4 adjoining the bared metal film 3 that etching medium cannot escape along the boundary between the gold and the photo resist into the metal film during the etching period.

In order to prevent an undercutting, which would be reinforced by contact corrosion, of the gold etching edges 62 while the metal film 3 is being etched (should such undercutting be problematic because of the narrow, tracks), the photographic exposure mask 51 has been formed such that a path of photo resist 43 remains at all the edges of the gold, overlapping the gold film and the metal film 3. Since with certain etching media the presence of gold during the etching process can result in a substantial prolongation of the etching times by passivating the films 2, 3 to be etched, the gold film 20 may be covered, prior to photographic exposure of the photo mask 51, with an additionally applied film (44 in FIG. 4) of photosensitive resist, for instance by spin depositing; this has the advantage that at the edges of the resist windows 41 of the photosensitive resist film 4, a somewhat thicker covering 46 of photosensitive resist is applied to the gold film. These ridges of resist 46 represent an additional protection against the escape of the etching medium for the contact-film etching and the resistance-film etching along the edge between the gold and the resist. The additional covering of resist on the gold film 6, 61 may become compulsory if, because of the prolongation of the contact-metallizing etching resulting from the presence of gold, the metal film 3 is undercut to a greater extent on the resist edges of the resistance tracks 45 and thus, with selective resistance-etching medium, if the resistance film 2 is also undercut to a greater extent, because the metal film 3 is the etching mask for the resistance film 2.

After the geometry of the circuit has been etched, the next step, in a third photographic exposure process (FIG. 3c) using the photo mask 52, is laying bare the parts of the circuit from which the resistors 22 are created by the selective etching away of the metal film 3. To this end, the areas 48 of the photosensitive resist film 4 are exposed to light and then removed by photographic developing.

The remaining film 4 of photosensitive resist is then dissolved following the selective resistance etching. The gold areas are protected with the aid of the screen-printed anti-solder film 7 prior to being tinned in the immersion bath, and at the points where a direct contact between the solder and the gold takes place, the gold covering 71 does not cover a portion 64 of the gold film 61; this portion 64 therefore dissolves in the solder, and the desired low-resistance contact is thus created.

Only after the laser-balancing of all the resistors has been effected and, in the case of ceramic substrates, pre-scratching has been accomplished by laser, is the anti-solder film washed off; the circuits are then separated into individual circuits and semiconductor units are bonded into them as indicated by the bonding wire 63; the remaining components are then soldered in, together with the connection rack, in the reflow process.

The invention is not restricted to the exemplary embodiment described in connection with the drawing. In particular, other materials than those mentioned may be used for both the resistance film 2 and for the metal film 3 capable of being soldered and of being reinforced by electroplating.

For the resistance film 2, for instance, an arbitrary valve metal or a valve metal nitride or a valve metal oxynitride can be used, as well as nickel-chrome or manganin.

For the metal film 3 capable of being soldered and of being reinforced by electroplating, for instance, it is possible to use, instead of the nickel film, a three-film system comprising the sequence of films of copper-iron-copper, copper-nickel-copper or copper-cobalt-copper.

I claim:

1. A method for producing an electronic thin-film circuit, having an insulating substrate plate (1) and a first pattern ($M_1$) of connection tracks, a second pattern ($M_2$) of circuit elements both deposited on said substrate plate (1) and blank spaces between said first and second patterns, comprising the steps of:
   (A) applying a continuous resistance film (2) to the substrate plate;
   (B) applying atop said continuous resistance film (2) a continuous metal film (3) capable of being soldered and of being reinforced by electroplating;
   (C) applying atop said continuous metal film (3) a photo-sensitive resist film (4);
   (D) introducing into the photo-sensitive resist film (4), by means of a first photographic exposure and development process, openings (41) corresponding to the desired first pattern ($M_1$) in order to delineate said connection tracks and facilitate their reinforcement with gold;
   (E) electro-depositing into each of said openings (41), and thus onto exposed portions of said metal film (3), a gold film (6,61);
   (F) removing, by means of a second photographic exposure and developing process, portions of the photo-sensitive resist film (4) from all areas of the metal film (3) which corresponds to said intended blank spaces
   (G) etching away, using as masks remaining portions of the photo-sensitive resist film (4) and the gold films (6,61), those portions of the metal (3) exposed by step (F);
   (H) removing, by means of a third photographic exposure and development process, portions of the photo-sensitive resist film (4) from areas (32) of the metal film (3) which are a part of said second pattern ($M_2$);
   (I) selectively etching away the metal film (3) at locations corresponding to the desired second pattern ($M_2$);
   (J) screen-printing anti-solder film (7,71) onto all areas of the first pattern ($M_1$) covered with the gold films (6,61), with the exception of a narrow end area (64) of said gold films (6,61) which is adjoined by an area of the first pattern ($M_1$) intended to be covered with soft solder;
   (K) immersing said circuit in liquid soft solder, in order to apply a soft-solder film (8) to the areas of the first pattern ($M_1$) not covered with the anti-solder film (7,71); and
   (L) dissolving away said anti-solder film (7,71).

2. A method as defined by claim 1, characterized in that the photographic exposure mask (51) used for the second photographic exposure process is formed such that at all the edges of the gold films (6, 61), a photosensitive resist path (43) remains thus overlapping these films (6, 61) and the metal film (3).

3. A method as defined by claim 1, characterized in that the electrodeposited gold films (6, 61) are covered, prior to the second photographic exposure process, with an additionally applied thin film (44) of photosensitive resist.

4. A method as defined by claim 2 characterized in that the electrodeposited gold films (6,61) are covered, prior to the second photographic exposure process, with an additonally applied thin film (44) of photosensitive resist.

5. A method as defined by claim 1 wherein said step of applying said continuous metal film includes forming between said resistance film (2) and said continuous metal film (3) an intermediate film acting as a diffusion block.

* * * * *